US005593901A

United States Patent [19]
Oswald et al.

[11] Patent Number: 5,593,901
[45] Date of Patent: Jan. 14, 1997

[54] MONOLITHIC SERIES AND PARALLEL CONNECTED PHOTOVOLTAIC MODULE

[75] Inventors: Robert Oswald, Newtown, Pa.; John Mongon, Trenton, N.J.; Peggy Weiss, Pennsburg, Pa.

[73] Assignee: Amoco/Enron Solar

[21] Appl. No.: 475,951

[22] Filed: Jun. 7, 1995

Related U.S. Application Data

[62] Division of Ser. No. 188,606, Jan. 28, 1994, abandoned, which is a continuation of Ser. No. 698,321, May 6, 1991, abandoned, which is a continuation of Ser. No. 405,265, Sep. 8, 1989, abandoned.

[51] Int. Cl.[6] ................................................... H01L 27/14
[52] U.S. Cl. ................................ 437/2; 437/4; 437/173
[58] Field of Search ............................. 437/2, 3, 4, 173, 437/226, 180, 205; 136/244, 256, 258; 257/461, 466; 156/644.1

[56] References Cited

U.S. PATENT DOCUMENTS

| | | | |
|---|---|---|---|
| 3,151,379 | 10/1964 | Escoffery | 29/25.3 |
| 3,723,178 | 3/1973 | Sohlbarand | 117/227 |
| 4,064,521 | 12/1977 | Carlson | 357/2 |
| 4,235,644 | 11/1980 | Needes | 136/256 |
| 4,292,092 | 9/1981 | Hanak | 148/1.5 |
| 4,315,096 | 2/1982 | Tyan et al. | 136/244 |
| 4,330,358 | 5/1982 | Grabmaier et al. | 156/603 |
| 4,331,703 | 5/1982 | Lindmayer | 427/37 |
| 4,357,200 | 11/1982 | Grabmaier | 156/603 |
| 4,388,346 | 6/1983 | Bickler | 427/58 |
| 4,419,530 | 12/1983 | Nath | 136/251 |
| 4,428,110 | 1/1984 | Kim | 29/572 |
| 4,443,652 | 4/1984 | Izu et al. | 136/251 |
| 4,487,989 | 12/1984 | Wakefield et al. | 437/2 |
| 4,511,600 | 4/1985 | Leas | 427/75 |
| 4,532,371 | 7/1985 | Hanak et al. | 136/249 |
| 4,542,255 | 9/1985 | Tanner et al. | 136/249 |

(List continued on next page.)

FOREIGN PATENT DOCUMENTS

| | | | |
|---|---|---|---|
| 57-211280 | 12/1982 | Japan | H01L 31/04 |
| 62-084569 | 4/1987 | Japan | H01L 31/04 |
| 63-016677 | 1/1988 | Japan | H01L 31/04 |
| 1-152768 | 6/1989 | Japan | H01L 31/04 |
| 1-231378 | 9/1989 | Japan | H01L 31/04 |
| 2-084778 | 3/1990 | Japan | H01L 31/04 |
| 2-237080 | 9/1990 | Japan | H01L 31/04 |
| 2080621 | 2/1982 | United Kingdom | H01L 31/06 |
| 89/05521 | 6/1989 | WIPO | H01L 31/02 |

OTHER PUBLICATIONS

Berman, E., and Mitchell, K. W., "High Efficiency Low Loss Tandem Photovoltaic Modules: The Way to Go", *Seventh Photovoltaic Solar Energy Conference*, Sevilla, Spain, Oct. 1986, pp. 442–451.

Milkovich, S. A., and Miller, L. F., "Electrode with Improved Adhesion", *IBM Technical Disclosure Bulletin*, vol. 8, No. 10, Mar. 1966, p. 1462.

K. F. Teng and R. W. Vest, "Metallization of Solar Cells with Ink Jet Printing and Silver Metallo–Organic Inks," *IEEE Trans. on Components, Hybrids, and Manufacturing Technology*, vol. 11, No. 3, Sep. 1988, pp. 291–297.

Primary Examiner—Tom Thomas
Assistant Examiner—S. Mulpuri
Attorney, Agent, or Firm—Thomas W. Tolpin

[57] ABSTRACT

A thin-film semiconductor device comprising a substrate and a front contact layer disposed on said substrate including a plurality of segments separated by first scribe lines, a plurality of the segments forming a submodule, and at least one of the submodules forming a module. A bus is provided for interconnecting two or more of the submodules in parallel with each other. A thin film of a semiconductor material is disposed on the front contact layer and a back contact layer disposed on the thin film of semiconductor material. The back contact layer is scribed along second scribe lines corresponding to and adjacent the first scribe lines. An interconnection is provided for interconnecting adjacent areas of the rear and back contact layers.

5 Claims, 9 Drawing Sheets

U.S. PATENT DOCUMENTS

| | | | |
|---|---|---|---|
| 4,581,620 | 4/1986 | Yamazaki et al. | 357/2 |
| 4,602,120 | 7/1986 | Wakefield et al. | 136/256 |
| 4,631,351 | 12/1986 | Tawada et al. | 136/244 |
| 4,652,693 | 3/1987 | Bar-On | 136/251 |
| 4,667,058 | 5/1987 | Catalano et al. | 136/244 |
| 4,668,840 | 5/1987 | Kiyama et al. | 136/244 |
| 4,689,874 | 9/1987 | Nishiura | 437/2 |
| 4,695,674 | 9/1987 | Bar-on | 437/2 |
| 4,721,629 | 1/1988 | Sakai et al. | 427/35 |
| 4,737,197 | 4/1988 | Nagahara et al. | 136/256 |
| 4,783,421 | 11/1988 | Carlson et al. | 437/4 |
| 4,784,701 | 11/1988 | Sakai et al. | 136/249 |
| 4,789,641 | 12/1988 | Inuzuka | 437/4 |
| 4,808,242 | 2/1989 | Murata et al. | 136/244 |
| 4,848,606 | 7/1989 | Taguchi et al. | 118/323 |
| 4,854,974 | 8/1989 | Carlson et al. | 136/244 |
| 4,892,592 | 1/1990 | Dickson et al. | 136/244 |
| 4,929,281 | 5/1990 | Wörner | 136/201 |
| 5,178,685 | 1/1993 | Borenstein et al. | 437/2 |
| 5,293,025 | 3/1994 | Wang | 427/53.1 |

MONOLITHIC SERIES AND PARALLEL CONNECTED PHOTOVOLTAIC MODULE

This application is a divisional of application Ser. No. 08/188,606, filed Jan. 28, 1994, now abandoned which is a continuation of application Ser. No. 07/698,321, filed May 6, 1991, now abandoned, which is a continuation of application Ser. No. 07/405,265, filed Sep. 8, 1989, now abandoned, and the benefit of this earliest filing date is hereby claimed under 35 U.S.C. § 120.

BACKGROUND OF THE INVENTION

1. Field of the Invention

The present invention relates to photovoltaic cells and, in particular, to an apparatus and a method for forming a monolithic interconnected photovoltaic module.

2. Description of the Related Art

As is well known in the thin-film semiconductor art, photovoltaic cells that convert solar radiation into usable electrical energy can be fabricated by sandwiching certain semiconductor structures, such as, for example, the amorphous silicon PIN structure disclosed in U.S. Pat. No. 4,064,521, between two electrodes. One of the electrodes typically is transparent to permit solar radiation to reach the semiconductor material. This "front" electrode (or contact) can be comprised of a thin film (i.e., less than 10 micrometers in thickness) of transparent conductive oxide material, such as tin oxide, and usually is formed between a transparent supporting substrate made of glass or plastic and the photovoltaic semiconductor material. The "back" electrode (or contact), which is formed on the surface of the semiconductor material opposite the front electrode, generally comprises a thin film of metal such as, for example, aluminum. Alternatively, the back electrode can be made of a transparent material such as tin oxide.

The voltage produced across the electrodes of a single photovoltaic cell, however, is insufficient for most applications. To achieve a useful power level from photovoltaic semiconductor devices, individual photovoltaic cells must be electrically connected in series in an array referred to herein as a photovoltaic "module." A typical arrangement of series-connected photovoltaic cells is shown in FIG. 1.

FIG. 1 shows photovoltaic module 10 comprised of a plurality of series-connected photovoltaic cells 12 formed on a transparent substrate 14 and subjected to solar radiation 16 passing through substrate 14. Each photovoltaic cell 12 includes a front electrode 18 of transparent conductive oxide, a photovoltaic element 20 made of a semiconductor material, such as, for example, hydrogenated amorphous silicon, and a back electrode 22 of a metal such as aluminum or of a transparent material such as tin oxide. Photovoltaic element 20 can comprise, for example, a PIN structure. Adjacent front electrodes 18 are separated by first grooves 24, which are filled with the semiconductor material of photovoltaic elements 20. The dielectric semiconductor material in first grooves 24 electrically insulates adjacent front electrodes 18. Adjacent photovoltaic elements 20 are separated by second grooves 26, which are filled with the metal of back electrodes 22 to provide a series connection between the front electrode of one cell and the back electrode of an adjacent cell. Adjacent back electrodes 22 are electrically isolated from one another by third grooves 28.

The thin-film photovoltaic module of FIG. 1 typically is manufactured by a deposition and patterning method. One example of a suitable technique for depositing a semiconductor material on a substrate is glow discharge in silane, as described, for example, in U.S. Pat. No. 4,064,521. Several patterning techniques are conventionally known for forming the grooves separating adjacent photovoltaic cells, including silkscreening with resist masks, etching with positive or negative photoresists, mechanical scribing, electrical discharge scribing, and laser scribing. Laser scribing and silkscreening methods have emerged as practical, cost-effective, high-volume processes for manufacturing thin-film semiconductor devices, including amorphous silicon photovoltaic modules. Laser scribing has an additional advantage over silkscreening because it can separate adjacent cells in a multi-cell device by forming separation grooves having a width less than 25 micrometers, compared to the typical silkscreened groove width of approximately 300–500 micrometers. A photovaltaic module fabricated with laser scribing thus has a large percentage of its surface area actively engaged in producing electricity and, consequently, has a higher efficiency than a module fabricated by silkscreening. A method of laser scribing the layers of a photovoltaic module is disclosed in U.S. Pat. No. 4,292,092.

Referring to FIG. 1, a method of fabricating a multi-cell photovoltaic module using laser scribing comprises; depositing a continuous film of transparent conductive oxide on a transparent substrate 14, scribing first grooves 24 to separate the transparent conductive oxide film into front electrodes 18, fabricating a continuous film of semiconductor material on top of front electrodes 18 and in first grooves 24, scribing second grooves 26 parallel and adjacent to first grooves 24 to separate the semiconductor material into individual photovoltaic elements 20 (or "segments") and expose portions of front electrodes 18 at the bottoms of the second grooves, forming a continuous film of metal on segments 20 and in second grooves 26 so that the metal forms electrical connections with front electrodes 18, and then scribing third grooves 28 parallel and adjacent to second grooves 26 to separate and electrically isolate adjacent back electrodes 22.

A distinct disadvantage of photovoltaic modules of the prior art has heretofore been the unavailability of large photovoltaic modules having the flexibility of producing any desired voltage output. By "large photovoltaic modules" it is meant such modules on the order of one foot square and large. By "small voltage output" it is meant 12–15 V or less.

It is well known that the voltage output of a photovoltaic module is directly related to the number of photovoltaic cells connected in series. That is, as the number of cells increases so does the voltage. In a large photovoltaic module, one approach to control the voltage output is to reduce the number of individual cells in the module while increasing their size, specifically their width. Such a module is disclosed in U.S. Pat. No. 4,542,255 issued to Tanner, et al. A disadvantage to the approach disclosed by Tanner, et al. is, however, that the fill factor of the individual cells decreases as the width of the cell increases. Thus, the efficiency, hence power output of the cell decreases as the size of the cells increases.

The present invention is intended to provide a photovoltaic module, and a method for making same, that is a large photovoltaic module, producing an optimal width of the individual cells to maximize their power output.

It is also desirable in some applications, such as the integration of photovoltaic modules into automobile sunroofs, to increase the transmittance of light through the photovoltaic module. This can be accomplished to a certain extent by making both the front and rear contacts (or "electrodes") transparent. Such transparent contacts can be made of, for example, tin oxide. The transmittance of the photovoltaic module can also be increased by reducing the width of each cell in the module to therefore increase the number of scribe lines in the photovoltaic module, hence its light transmittance. As discussed above, decreasing cell width has the effect of increasing the overall voltage of the resulting series-connected photovoltaic module. Such high voltage is not desired for some applications.

It is further intended that the present invention provide a photovoltaic module having individual cells of reduced width while maintaining the output voltage of the photovoltaic module at any desired level.

The present invention also relates to a method for depositing an elongated narrow band conductive pattern. In prior art methods, such as Tanner, et al., such conductive patterns were deposited by a silkscreening method. Silkscreening, however, is wasteful of conductive fluid used to make a conductive pattern, is not easily automated, and produces poor reproducibility. Further, it is difficult to control the thickness of patterns produced.

The present invention is intended to provide a method for depositing an elongated conductive pattern that is not wasteful of conductive fluid used, is susceptible to computer control to produce reproducible patterns and which produces a pattern that has a thickness that can be easily controlled.

Additional advantages of the present invention will be set forth in part in the description that follows and in part will be obvious from that description or can be learned from practice of the invention. The advantages of the invention can be realized and obtained by the method particularly pointed out in the appended claims.

SUMMARY OF THE INVENTION

To overcome the problems of the prior art methods and in accordance with the purpose of the invention, as embodied and broadly described herein, a thin-film semiconductor device of the present invention comprises a substrate and a front contact layer disposed on the substrate including a plurality of segments separated by first scribe lines, a plurality of the segments forming a submodule, and at least one of the submodules forming a module.

First bus means is provided for connecting in parallel the submodules. A thin film of a semiconductor material is disposed on the front contact layer and a back contact layer is disposed on the thin film of semiconductor material. The back contact layer is scribed along second scribe lines corresponding to and adjacent the first scribe lines. Interconnection means are provided for interconnecting adjacent areas of the front and back contact layers.

Also in accordance with the present invention, a method is provided for depositing an elongated narrow band solid conductive pattern on a semiconductor substrate. The method comprises depositing conductive fluid comprising a conductive metallic or organometallic component in an elongated narrow band pattern on such substrates and causing such deposited fluid to solidify to form a solid elongated narrow band pattern on such substrate in substantially the same pattern as that formed by such conductive fluid.

Further, a method is provided for depositing an elongated narrow band conductive pattern on a semiconductor substrate. The method comprises depositing conductive fluid comprising a conductive metallic or organometallic component and carrier fluid in a narrow band pattern on a semiconductor substrate and substantially removing the carrier fluid from such conductive fluid deposited on the substrate to form a solid relatively immobile pattern of the conductive metallic or organometallic component on such substrate.

BRIEF DESCRIPTION OF THE DRAWINGS

The accompanying drawings, which are incorporated in and which constitute a part of the specification, illustrate at least one embodiment of the invention and, together with the description, explain the principles of the invention.

DESCRIPTION OF THE PREFERRED EMBODIMENTS

Reference now will be made in detail to the presently preferred embodiments of the invention, examples of which are illustrated in the accompanying drawings.

Figure 1:
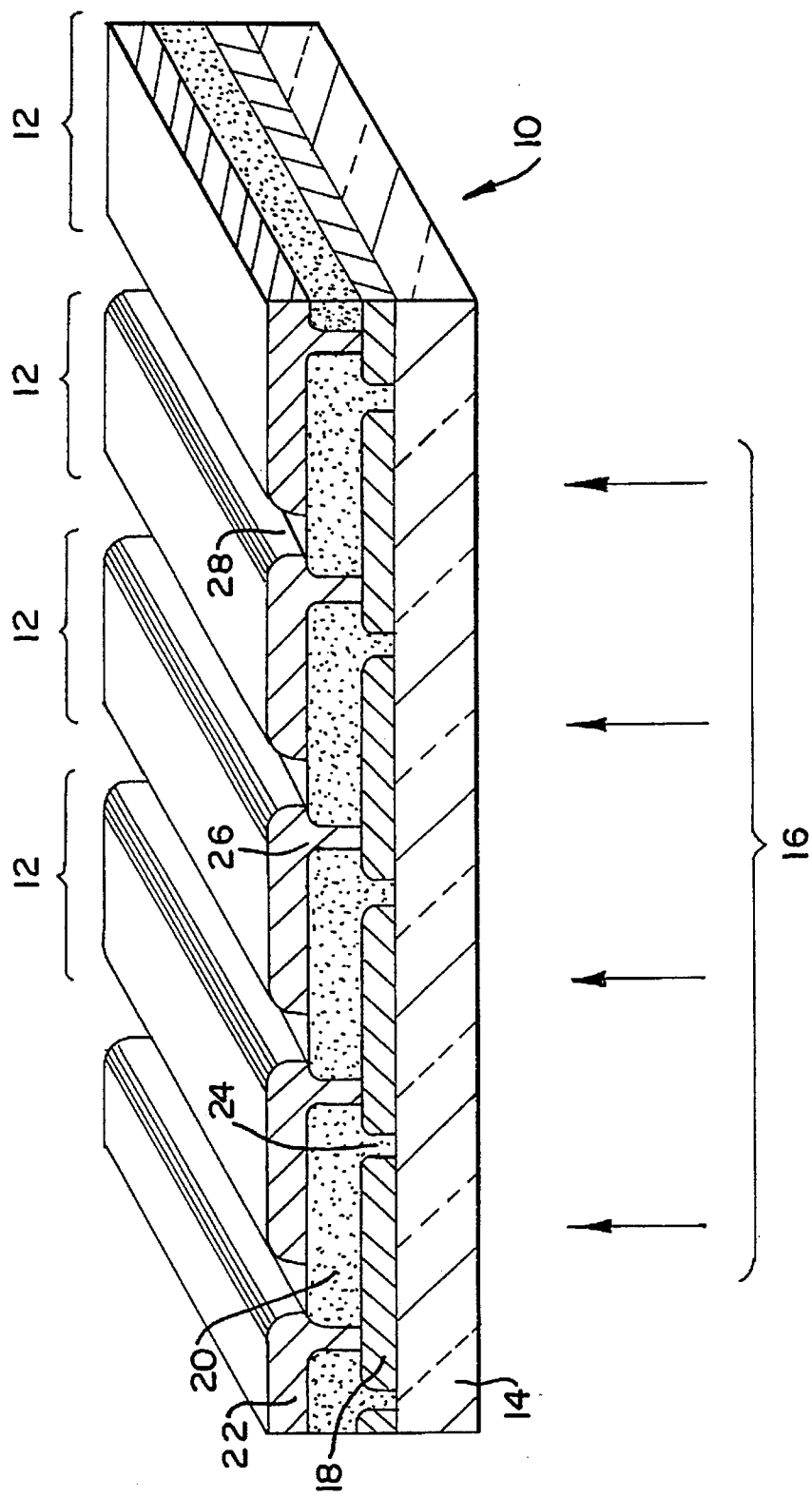
FIG. 1 is a schematic perspective view of a prior art photovoltaic module fabricated according to a prior art method.
Figure 2A:
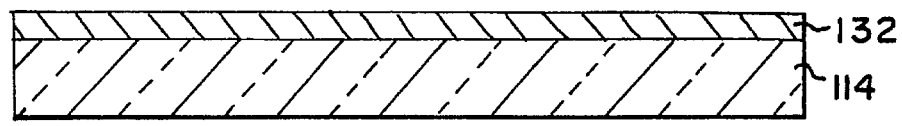
FIGS. 2(a)–2(g) are schematic cross sectional views depicting the steps in a method for fabricating a photovoltaic module having laser-patterned back electrodes.
Figure 2B:
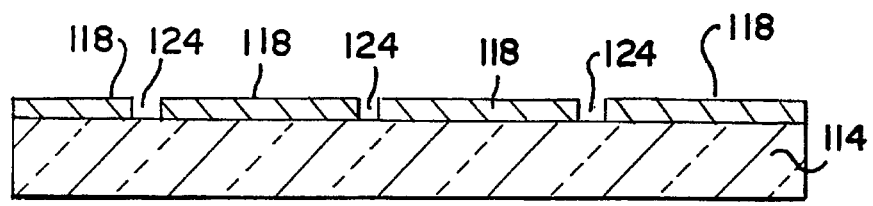
Figure 2C:
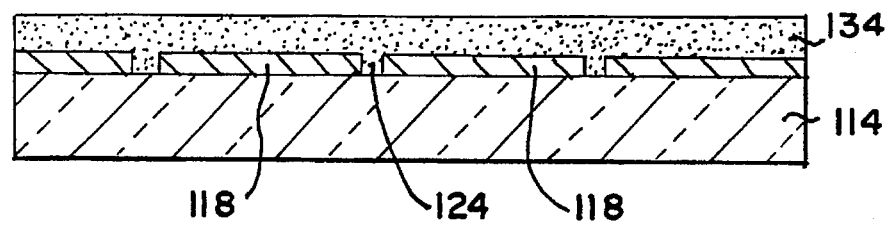
Figure 2D:
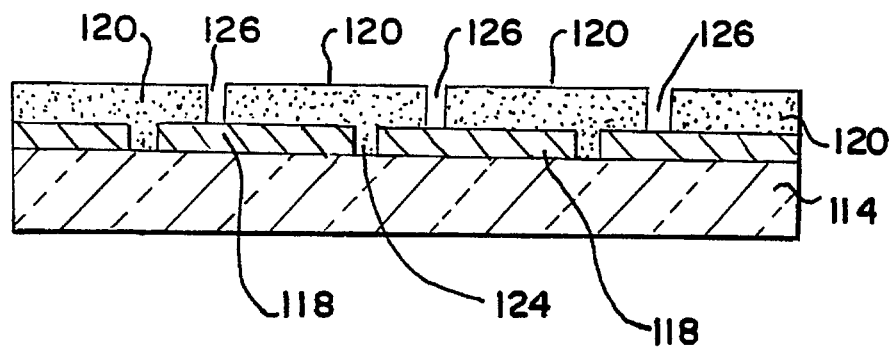
Figure 2E:
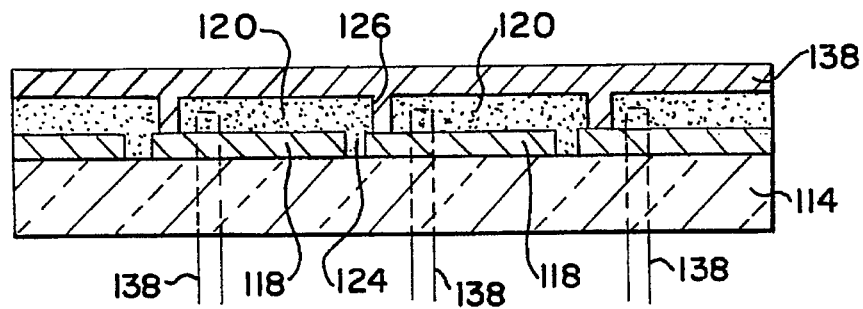
Figure 2F:
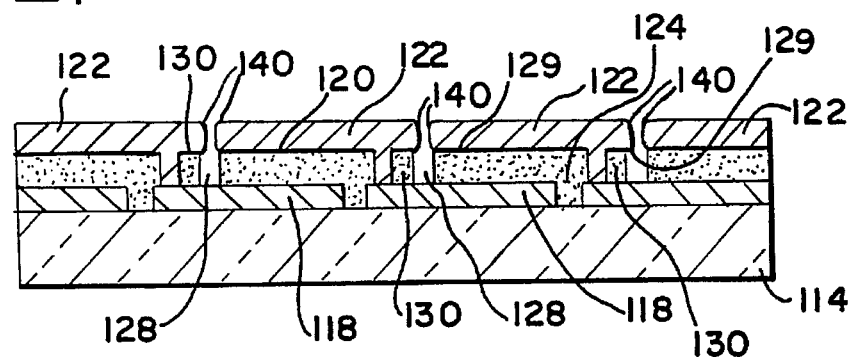
Figure 2G:
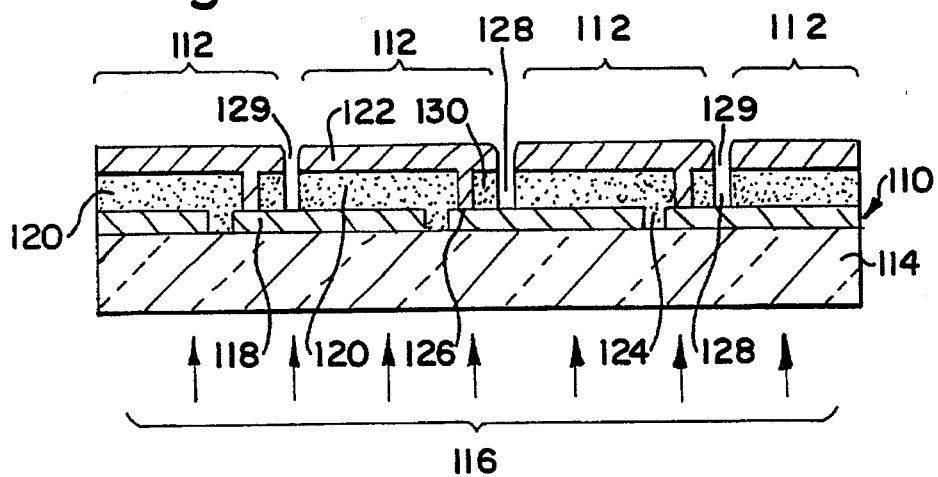

FIG. 2(g) is a schematic cross sectional view of a portion of a multi-cell thin-film photovoltaic module, designated generally by reference numeral 110. Photovoltaic module 110 is comprised of a plurality of series-connected photovoltaic cells 112 formed on a flat, transparent substrate 114. In operation, photovoltaic module 110 generates electricity in response to solar radiation 116 passing through substrate 114, which preferably is formed of glass. Each photovoltaic cell 112 includes a front electrode segment 118 of transparent conductive oxide, a photovoltaic element 120 made of semiconductor material, such as, for example, hydrogenated amorphous silicon, and a back electrode 122 of a metal such as aluminum or a conductive material such as tin oxide. Adjacent front electrode segments 118 are separated by first grooves 124, which are filled with the semiconductor material of photovoltaic elements 120. Adjacent photovoltaic elements 120 are separated by second grooves 126 and also by third grooves 128. An inactive portion 130 of semiconductor material is positioned between second groove 126 and third groove 128. Portions 130 are "inactive" in the sense that they do not contribute to the conversion of solar radiation 116 into electricity. Second grooves 126 are filled with the material of back electrodes 122 to provide a series connection between the front electrode of one cell and the back electrode of an adjacent cell. Gaps 129, located at the tops of third grooves 128, separate and electrically isolate adjacent back electrodes 122.

The method for forming photovoltaic module 110 now will be described with reference to FIGS. 2(a) through 2(g).

In accordance with the invention, a substantially continuous film 132 of transparent conductive oxide material, preferably fluorinated tin oxide, is fabricated on transparent substrate 114 as shown in FIG. 2(a). Conductive oxide film 132 can be fabricated in a manner well known in the art, for example, by chemical vapor deposition. The thickness of the transparent conductive oxide film will vary depending upon the desired application of the photovoltaic module.

Conductive oxide film 132 then is scribed with a laser to ablate the conductive oxide material along a first predetermined pattern of lines and form preferably parallel first grooves 124, which divide film 132 into a plurality of parallel front electrodes 118, as shown in FIG. 2(b). U.S. Pat. No. 4,292,092 discloses one suitable laser scribing technique, although certainly not the only suitable technique. Scribing can be performed either by moving the beam of the laser with respect to the substrate or by mounting the substrate on a X-Y table that is movable with respect to the beam of the laser. Scribing preferably is done from the front (through substrate 114) but can be done from the back (directly on conductive oxide film 132) as well. First grooves 124 preferably are about 25 micrometers in width.

Figure 3:
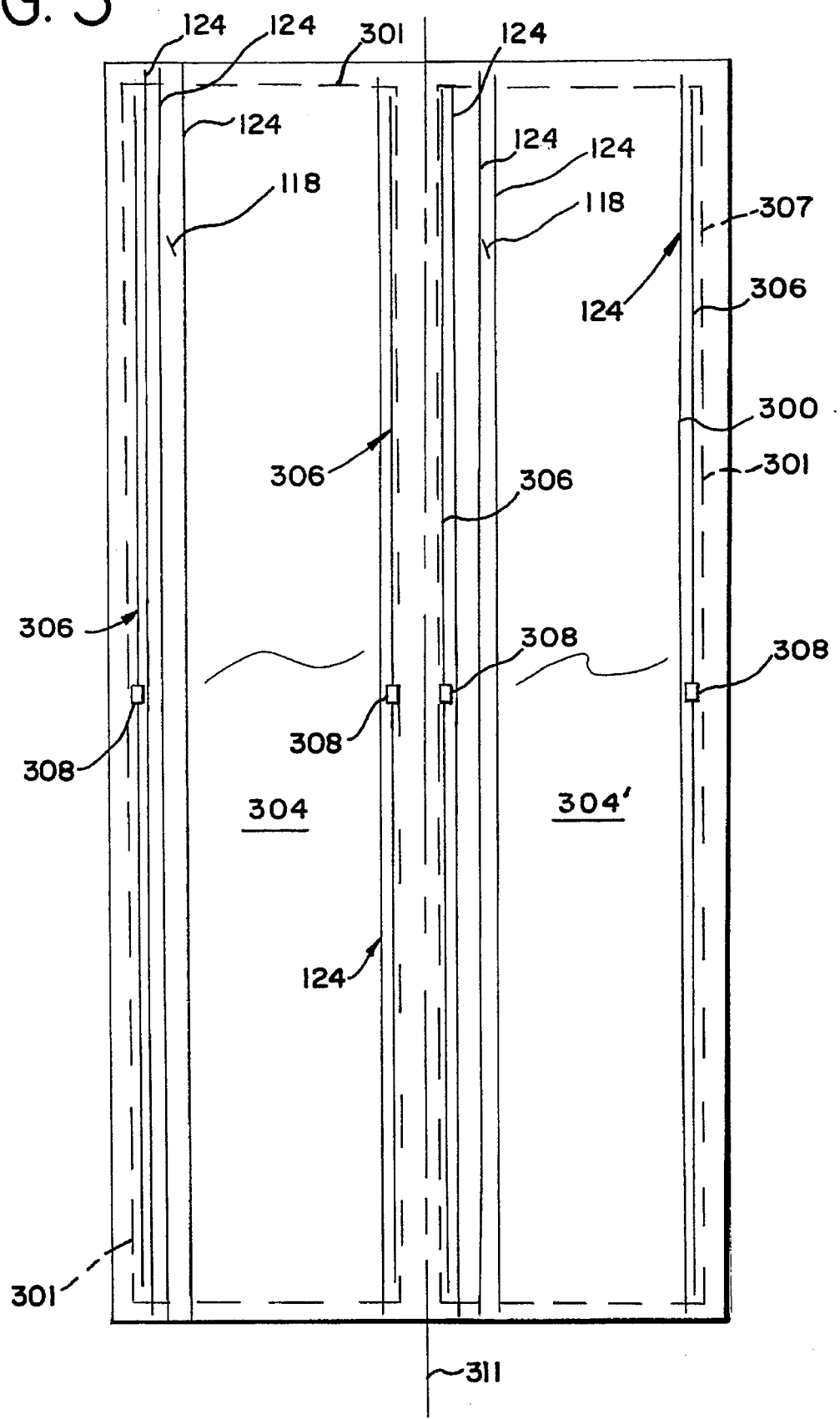
FIG. 3 is a schematic top view of a substrate having a scribed front conductive layer disposed thereon and a connection strip disposed on the front conductive layer.

As shown in FIG. 3, one embodiment of a front contact layer as shown in accordance with the present invention is disposed on a substrate. The front contact layer in accordance with the present invention includes a plurality of segments 118 separated by first scribe lines 124. An isolation scribe 301 (as shown in dotted outline) is provided to ensure that the adjacent segments are not short-circuited to one another. As shown in FIG. 3, segments 110 are oriented to one another and separated by first scribe lines 124. A plurality of segments 118 are grouped together to form a submodule 304. At least one of the submodules 304 are grouped together to form a module. Clearly, when there is but one submodule 304 in a module, as is the case of submodules 304 in FIG. 3, then the two are co-extensive.

In one embodiment of the present invention, as shown in FIG. 3, two submodules 304 and 304' are disposed side-by-side on a substrate. Each of the submodules 304 and 304' includes a plurality of segments 118 disposed side-by-side and separated by first scribe lines 124. As is known, to make use of a photovoltaic module a connection must be formed to each end of the series of photovoltaic modules in a module. In a device in accordance with the present invention, such connections are provided by connection strips 306. Connection strips 306 include solder pads 308 to which wires can be connected through soldering, for example, to allow the module to be connected to equipment (not shown) to be powered by the module.

The two submodules 304 and 304' can be separated by cutting them apart along cut-line 311.

Figure 4:
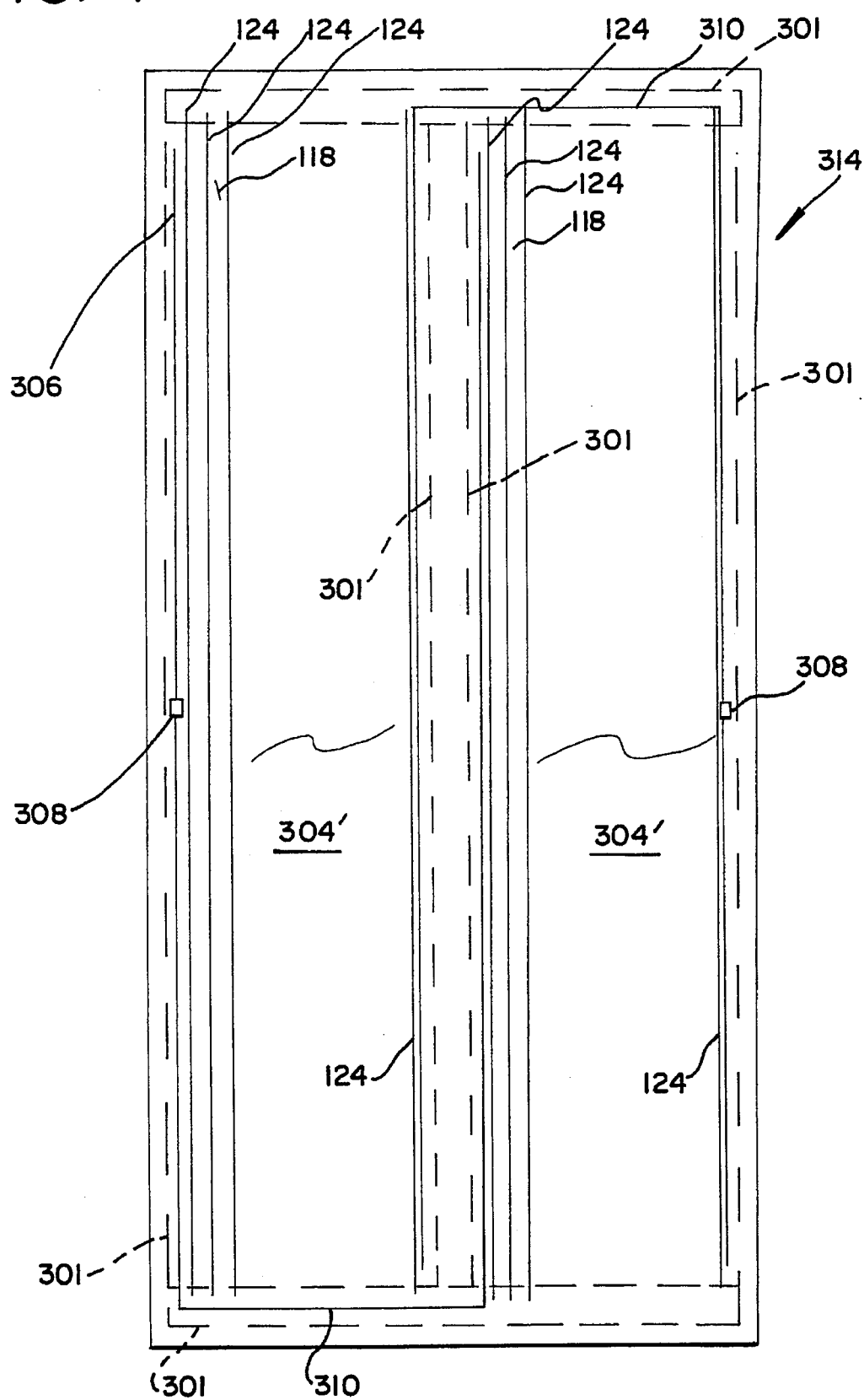
FIG. 4 is a schematic top view of a substrate having a scribed front conductive layer disposed thereon and a connection strip and bus bar means disposed on the front conductive layer.

In another embodiment of the present invention, as shown in FIG. 4, two submodules 304' and 304" are disposed side-by-side on a substrate. Each of the submodules includes a plurality of segments 118 disposed side-by-side and separated by scribe lines 124. To this point, then, the embodiment of FIG. 4 is similar to the embodiment of FIG. 3. In the present embodiment, however, first bus means 310 are provided to interconnect submodules 304' and 304". First bus means 310 are made sufficiently long and so oriented so as to place the first and second submodules in parallel connection with each other. That is, for example, the positive sides of each submodule are interconnected and the negative sides of each submodule 304' and 304" are interconnected to form a single module 314. In this way, the voltage output of the resulting module is the same as the voltage output of each of its constituent two submodules. Moreover, the current output of the module is twice that of the current output of its two constituent submodules.

Figure 5:
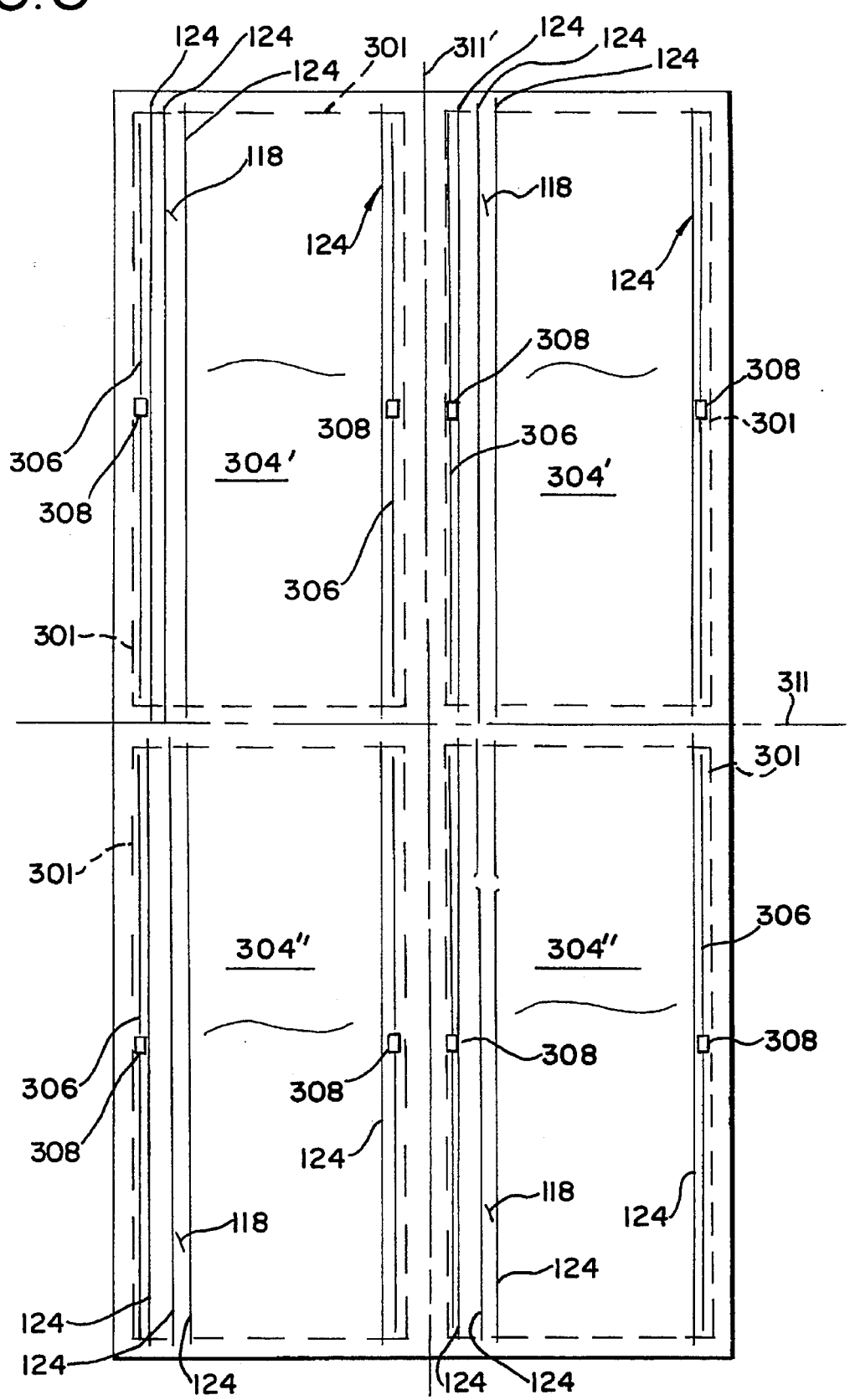
FIG. 5 is a schematic top view of a substrate having a scribed front conductive layer disposed thereon and a connection strip disposed on the front conductive layer.

FIG. 5 shows another embodiment of the present invention wherein four submodules 304–304''' have been fabricated on a single substrate, each including a plurality of segments 118 separated by scribe lines 124. Connection strips 306 are provided at either end of each submodule to provide a collection and connection point for the power output from each series-connected submodule. The individual submodules can be separated or cut apart along cut-lines 311 and 311'.

Figure 6:
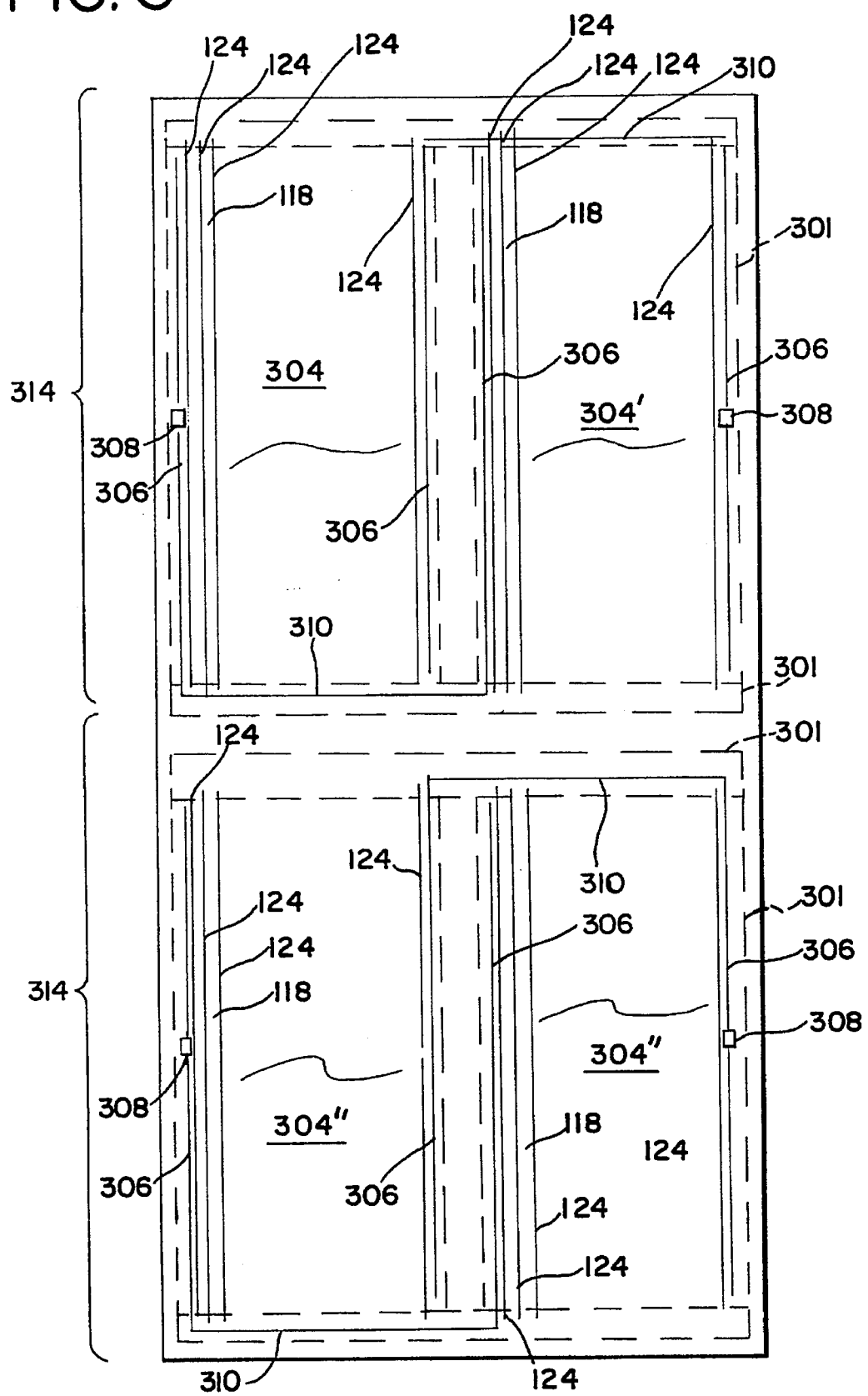
FIG. 6 is a schematic top view of a substrate having a scribed front conductive layer disposed thereon and a connection strip and bus bar means disposed on the front conductive layer.

In another embodiment of the present invention, as shown in FIG. 6, four submodules 304–304''' are disposed on a substrate. Each of the submodules includes a plurality of segments 118 disposed side-by-side and separated by scribe lines 124. To this point, then, the embodiment of FIG. 6 is similar to the embodiment of FIG. 5. In the embodiment of FIG. 6, however, first bus means 310 are provided to interconnect submodules 304 and 304' in parallel to form module 314 and interconnect submodules 304" and 304''' in parallel to form module 314'.

The following examples illustrate the manner in which photovoltaic modules in accordance with the present invention can be made.

EXAMPLE I

The present example relates to the fabrication of two separate submodules on a two foot by four foot substrate. Such an apparatus is shown, for example in FIG. 3. It has been calculated that two submodules could be disposed on a substrate, each having 28 segments. The individual segment sizes would thus be 0.375"×47" (0.953 cm×119.38 cm). Given this segment size, the individual segment area would be 114 cm². It has been calculated that $V_{LD}$ would be 15V and that $I_{LD}$ would be 1.200 amps for each submodule, where LD refers to the value "at load".

The individual submodules may be separated from one another by, for example, cutting along cut-line 310.

EXAMPLE II

The present example relates to the fabrication of a single module comprising two submodules, as shown in FIG. 4. It has been calculated that two submodules could be disposed on a substrate of two foot by four foot dimensions. Each submodule would include 28 segments 0.388" (0.985 cm)× 46.50" (118.11 cm) in size. These segment dimensions provide a segment area of 116.33 cm² and a submodule area of 3257.24 cm². The $V_{LD}$ is calculated as 15 V and the $I_{LD}$ is 1.233 amps. By providing a bus to interconnect the submodules together in parallel, a module having a $V_{LD}$ of 15 V can be achieved having an $I_{LD}$ of 2.466 amps.

EXAMPLE III

The present example relates to the fabrication of four separate submodules on a two foot by four foot substrate as shown, for example, in FIG. 5. It has been calculated that four submodules could be disposed on the substrate, each having 28 segments. The individual segment sizes would thus be 0.375" (0.953 cm)×23" (58.42 cm) to provide an individual segment area of 55.67 cm² and a submodule area of 1559 cm². It has been calculated that the $V_{LD}$ for each submodule would be 15 V and a $I_{LD}$ of 590 mA for each submodule.

The individual submodules can then be separated along cut lines 311 and 311' shown in FIG. 5 to separate the four submodules from one another.

EXAMPLE IV

The present example relates to the fabrication of two modules, each including two submodules, on a two foot by four foot substrate, as shown, for example, in FIG. 6. It has been calculated that four submodules could be disposed on a two foot by four foot substrate, each submodule including 28 segments 0.388 in. (0.985 cm)×22.5 in. (57.15 cm) in size. Such segment dimensions produce a segment area of 56.32 cm² and a submodule area of 1577 cm². The $V_{LD}$ is calculated as $V_{LD}$ at 15 V and $I_{LD}$ is 0.597 amps. By providing a bus to interconnect two submodules in parallel, a module having a $V_{LD}$ of 15 V can be achieved having a $I_{LD}$ of 1.190 amps. As shown in FIG. 6, the two modules, 314 and 314', each including two parallel connected submodules, can be separated along a cut line.

The first bus means is accomplished by a method in accordance with the present invention for depositing an elongated narrow band pattern on a substrate. The conductive patterns of this invention comprise the connector strips and bus bars and are made of conductive materials.

The conductive patterns are generally made by depositing conductive fluid on a substrate which conductive fluid comprises a conductive metallic or organometallic component such as silver, copper, nickel, aluminum, gold, platinum, palladium, or mixtures thereof. The conductive fluid may also preferably comprise a carrier fluid which aids in the transmission of the conductive metallic or organometallic components. The conductive fluid should provide a conductive fluid which is relatively homogeneous and of proper viscosity for deposition in the desired pattern. The viscosity should not be so low as to provide a runny fluid which is difficult to control or which might separate out various components, nor should the viscosity be so high as to plug deposition equipment or be difficult to pattern evenly. Preferably the carrier fluid can be removed from the conductive fluid at conditions which are not extreme and would not lead to deterioration of the conductive material or the substrate. It is preferable that the carrier fluid be removable by subjecting the conductive fluid to moderate heat for a short period of time.

The conductive fluid may desirably also comprise glass frits which can help form a conductive material having improved mechanical strength and adhesion properties to the substrate. When glass frits are used, it is desirable to heat the conductive fluid for a period after deposition on the substrate to sinter the glass frit and form conductive material having the desired properties. The temperature and time necessary for this step may vary depending on the nature of the conductive fluid including the frit but generally range from about 500° C. to about 700° C.

Metech 3221, manufactured by Metech, Inc. of Elverson, Pa., USA, has been found to be a suitable conductive fluid for this type of process and is a paste comprised of silver particles and glass frit in binder and solvent. The manufacturer represents this material to be 65% by weight silver having a resistivity of <2.0 milliohms/sq. and a viscosity of 4–8 kcps.

Figure 7:
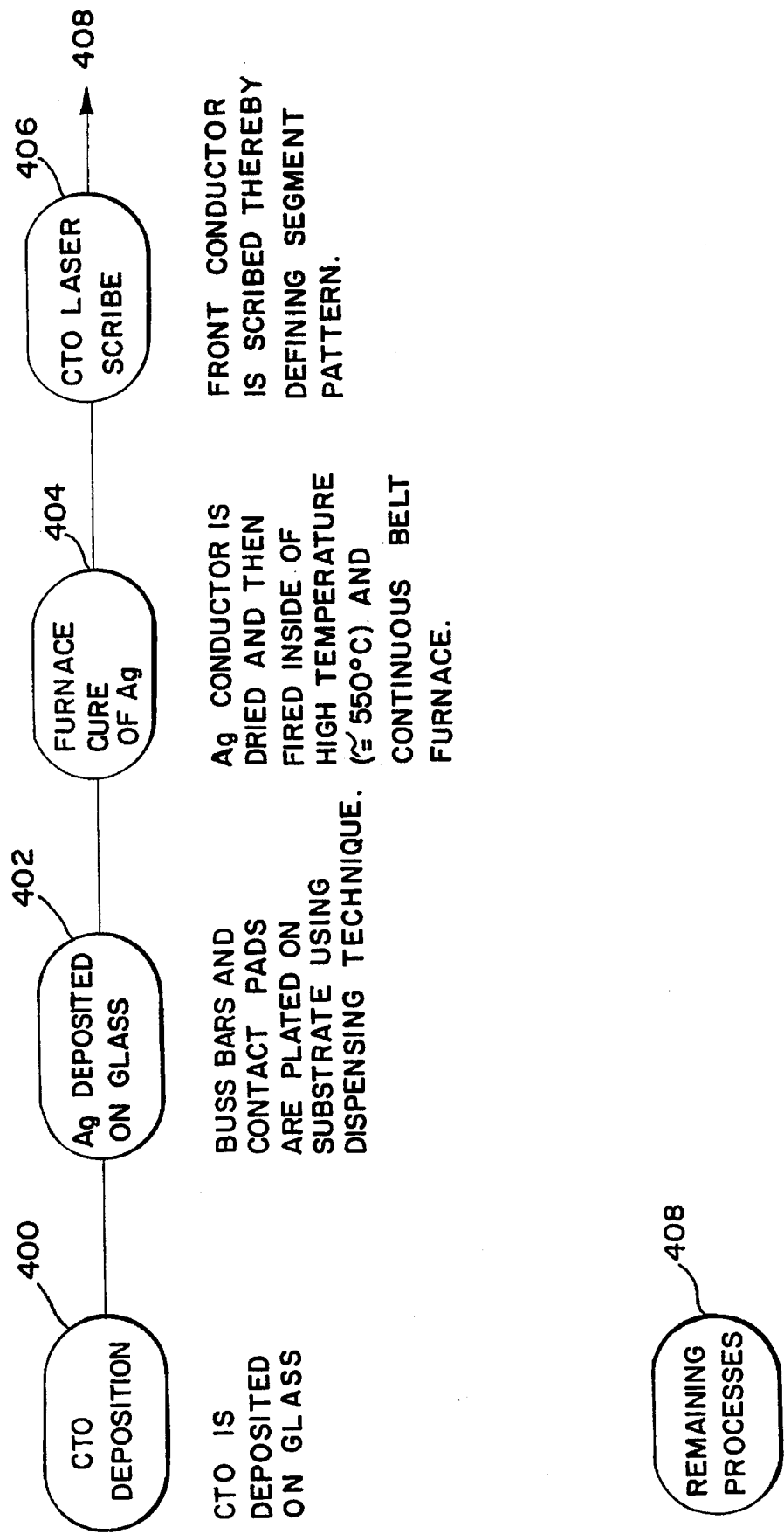
FIG. 7 is a flow chart showing the steps performed in disposing a connection strip and bus bar means on a front conductive layer.

In a method in accordance with the present invention, as shown in flow chart form in FIG. 7, conductive tin oxide (CTO) is deposited on a substrate (step 400), such as glass, to form a front contact layer 132. Next the conductive material, preferably Ag, is deposited on the CTO layer 132 (step 402). Preferably, the conductive material in Metech 3221M, as discussed above, dispensed by a dispensing system manufactured by Electronic Fusion Devices having a 725D valve and positioned by an Asymtek 402B position system. The deposition of the conductive material being accomplished preferably under the following conditions:

Deposition Rates:
  Acceleration—50"/sec/sec
  Velocity—7.0"/sec
Snap-off Setpoint—0.008"
Film Thickness—0.0005"–0.0100"
Film Length—As required Following the deposition of the conductive material it is thermally cured (step 404). This is preferably performed in a multi-chamber system at a rate of 12"/min belt speed (continuous belt) for a dry time of 1 minute at 200° C. then a fire time of 5 minutes at 550° C.

Following thermal cure, the front contact layer 132 is laser scribed to form scribe lines 124 (step 406). This is performed in the manner described above. Following laser scribing of scribe lines 124, the remaining steps in the fabrication of the photovoltaic module as shown in FIGS. 2(c) to 2(g) as described herein are performed as described below.

Figure 8:
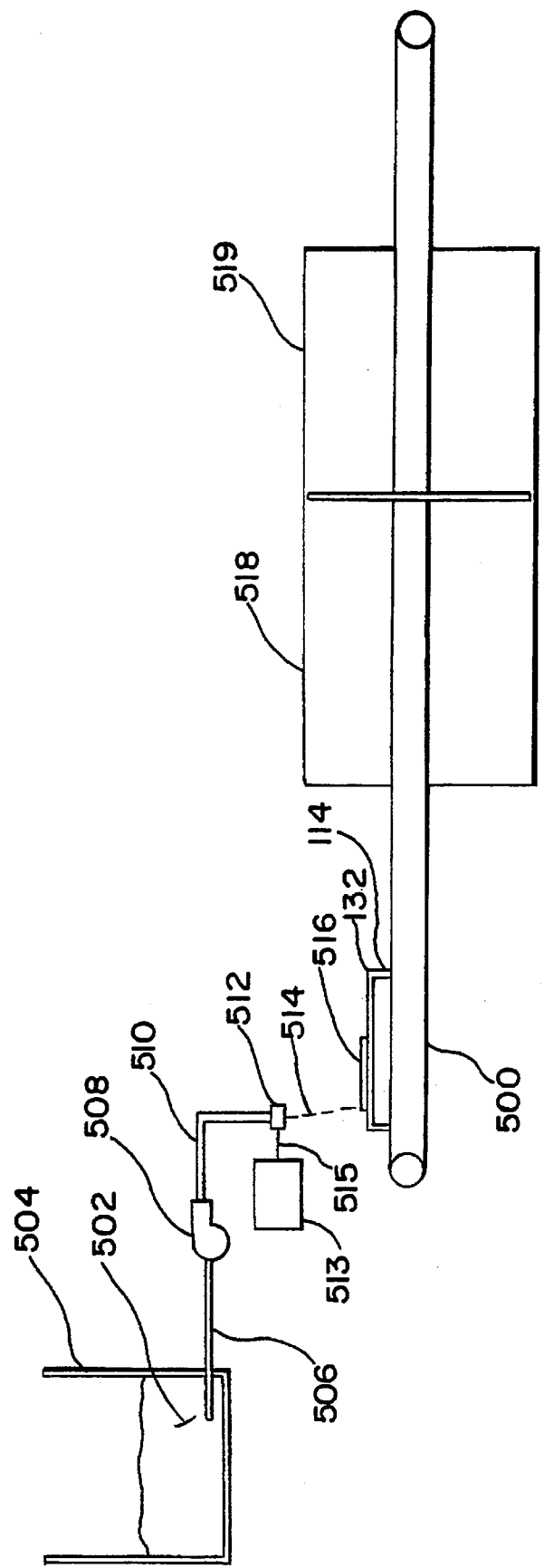
FIG. 8 is a schematic block diagram of an apparatus useful in performing the method of FIG. 7.

FIG. 8 shows an apparatus useful in carrying out the process shown in flow chart form in FIG. 7 and described in reference thereto. A substrate 114 having a layer 132 disposed thereon (as shown in FIG. 2(a), and described in reference thereto) is provided and placed on a conveyor belt 500. A conductive liquid 502 is disposed in a reservoir 504 and provided, via a conduit 506 to a pump 508. Preferably, pump 508 is a positive displacement pump. Pump 508 increases the pressure of conductive liquid 502 and supplies it along a conduit 510 to a nozzle 512. Conductive liquid 502 is forced out of nozzle 512 and directed along a stream 514 towards substrate 114 having a conductive layer 132 on it. The nozzle 512 is positioned via an X-Y-Z positioner 513 and a mechanical link 515. The position of nozzle 512 is thereby changed to form a pattern 516 on conductive layer 132. Pattern 516 can be, for example, in the form of conductive strips 306, solder pad 308, and first bus bars 310 of FIGS. 4 and 6.

Conveyor belt 500 is then energized to move substrate 114, having conductive layer 132 and pattern 516 thereon, into first oven 518. When, for example, conductive liquid 502 is Metech 3211M, as described above, pattern 516 is dried at 200° C. for one minute in first oven 518. Conveyor belt 500 is then energized again to move substrate 114 into second oven 519 whereupon it is fired at 550° C. for approximately five minutes.

It should be noted that in FIGS. 2(a) to 2(g), the front contact layer 132 is shown but the bus means is not. It should be understood, however, that the bus means is disposed on front contact layer 132 in the manner described above following which the steps shown in FIGS. 2(c) to 2(g) are performed.

In accordance with the invention, a photovoltaic region comprised of a substantially continuous thin film 134 of semiconductor material then is fabricated over front electrodes 118 and in first grooves 24, as shown in FIG. 2(c). The semiconductor material filling first grooves 124 provides electrical insulation between adjacent front electrodes 118.

Preferably, the photovoltaic region is made of hydrogenated amorphous silicon in a conventional PIN structure (not shown) and is approximately 6000Å in thickness, being comprised of a p-layer of 100Å, an i-layer of 5200–5500Å, and an n-layer of 500Å. Deposition preferably is by glow discharge in silane, as described, for example, in U.S. Pat. No. 4,064,521. Alternatively, the semiconductor material may be Cds/CuInSe$_2$ and CdTe.

In accordance with the first embodiment of the method of this invention, the semiconductor film 134 then is scribed with a laser to ablate the semiconductor material along a second predetermined pattern of lines and form second grooves 126, which divide semiconductor film 134 into a plurality of photovoltaic elements 120, as shown in FIG. 2(d). Front electrodes 118 are exposed at the bottoms of second grooves 126. Scribing may be performed with the same laser used to scribe transparent conductive oxide layer 132, except that power density is reduced to a level that will ablate the semiconductor material without affecting the conductive oxide of front electrodes 118. Consequently, the laser scribing of semiconductor film 134 also can be performed from either side of substrate 114. Second grooves 126 preferably are scribed adjacent and parallel to first grooves 124 and preferably are approximately 100 micrometers in width.

In accordance with the method of the first embodiment of this invention, a thin film 136 of conductive material such as metal, preferably aluminum, or a transparent conductor such as tin oxide, then is fabricated over photovoltaic elements 120 and in second grooves 126, as shown in FIG. 2(e). The conductive material filling second grooves 126 provides electrical connections between film 136 and the portions of front electrodes 118 exposed at the bottoms of second grooves 126. Conductive film 136 is formed, for example, by sputtering or other well known techniques, the thickness of film 136 depending on the intended application of the module. As an example, for modules intended to generate sufficient power to charge 12-volt storage battery, metal film 136 typically is formed of aluminum and is about 7000 Å thick.

According to prior art laser scribing methods, the next step would be to scribe metal film 136 with a laser to ablate the metal along a pattern of lines and form a series of grooves dividing film 136 into a plurality of back electrodes. This method, as taught, for example, by U.S. Pat. No. 4,292,092, has proved to be impractical. Because of the high reflectivity of aluminum and other metals conventionally used to form the back electrodes, the laser used to scribe the back electrode film must be operated at a significantly higher power density than those used to scribe second grooves 126 in semiconductor film 134, often 10 to 20 times higher.

For example, if metal film 136 is formed of aluminum and is about 7000Å thick, and if the aluminum is to be directly ablated by a frequency-doubled neodymium:YAG laser emitting light having a wavelength of about 0.53 micrometers and operated in a TEM$_{00}$ (spherical) mode, the laser typically would be focused to about 0.25 micrometers and operated at about 300 mW. When the same laser is used to ablate semiconductor film 134 and form second grooves 126, it preferably is defocused to 100 micrometers and is operated at about 360 mW. Although the laser would be operated at a slightly lower power level for direct ablation of aluminum, the number of photons per second per unit area, that is, the power density of the laser, also is a function of the spot size of the laser beam. For a give power level, power density varies inversely with the square of the radius of the spot. Thus, in the example described above, the laser power density required for direct ablation of the aluminum film is about 13 times the power density required to ablate the amorphous silicon film.

It has been found that it is difficult to prevent a laser operating at the power density necessary for direct ablation of aluminum from damaging the underlying semiconductor material. Specifically, the photovoltaic cell becomes shorted due to molten metal flowing into the scribed groove and electrically connecting adjacent back electrodes, or due to molten metal diffusing into the underlying semiconductor material and producing a short across a photovoltaic element. In addition, where the underlying semiconductor material is comprised of amorphous silicon, we have discovered that the underlying amorphous silicon material recrystallizes. Moreover, in an amorphous silicon PIN structure dopants from the n-layer or p-layer often diffuse into the recrystallized amorphous silicon of the i-layer.

Therefore, in accordance with the first embodiment of the present invention, after fabrication of metal film 136, the photovoltaic regions 120 underlying metal film 136 are scribed with a laser operated at a power density sufficient to ablate the semiconductor material along a predetermined pattern of third lines parallel to and adjacent second grooves 126 but insufficient to ablate the conductive oxide of front electrodes 118 or the metal of film 136. More specifically, the laser must be operated at a power level that will ablate the semiconductor material and produce gases that structurally weaken and burst through the portions of the metal film positioned along the third lines to form substantially continuous gaps in the metal film along the third lines and separate the metal film into a plurality of back electrodes. As shown in FIG. 2(e), where the laser beams are shown schematically and designated by reference numerals 138, laser patterning of metal film 136 by ablation of the underlying semiconductor material is performed through substrate 114.

The method of this invention for patterning a metal film fabricated on a thin film of semiconductor material can be applied to thin film semiconductor devices having structures different from the specific embodiment shown in the drawings and discussed herein. As will be apparent to those of ordinary skill in the art, however, the method of this invention should not be applied to structures having films or layers of material disposed on the laser-incident side of the semiconductor film if such intervening films or layers will interfere with the propagation of the laser beam to the semiconductor film or if such intervening films or layers will inappropriately react with the laser in a manner that would, for example, damage the resulting semiconductor device.

In accordance with this invention, ablating the semiconductor material of photovoltaic regions 120 along the pattern of third lines forms third grooves 128 in the semiconductor material, as seen in FIG. 2(f). Third grooves 128 preferably are about 100 micrometers wide and are spaced apart from second grooves 126 by inactive portions 130 of semiconductor material. As described above, the ablation of the semiconductor material formerly in third grooves 128 produces gases, for example, silicon gas from the ablation of amorphous silicon, which structurally weaken and burst through the portions of metal film 136 overlying the ablated semiconductor material to form gaps 129 that separate film 136 into a plurality of back electrodes 122.

Gaps 129 preferably are substantially continuous as viewed along a line orthogonal to the plane of FIG. 2(f). The laser parameters required to produce continuous gaps 129 in metal film 136 will, of course, depend on a number of factors, such as the thickness and material of the metal film, the characteristic wavelength of the laser, the power density of the laser, the pulse rate of the laser, and the scribing feed rate. We have found that, to pattern a film of aluminum having a thickness of about 3000–7000Å by ablation of an underlying amorphous silicon film approximately 6000Å in thickness with a frequency-doubled neodymium:YAG laser emitting light having a wavelength of about 0.53 micrometers, when the pulse rate of the laser is about 5 kHz, and the feed rate is about 13 cm/sec, the laser should be focused to about 100 micrometers in a $TEM_{00}$ (spherical) mode and operated at about 320–370 mW. Under the above conditions, when the laser is operated at less than about 320 mW, portions of metal film 136 remain as bridges across third grooves 128 and produce shorts between adjacent cells. When the laser is operated above about 370 mW, continuous gaps 129 are produced, but the performance of the resulting module, as measured by the fill factor, is degraded. Although the precise cause of degraded performance presently is unknown, we believe that the higher laser power levels cause melting of portions of the amorphous silicon photovoltaic elements that remain after third grooves 128 are ablated. In addition, the increased power densities cause the laser to cut into front electrodes 118, which increases series resistance and, if the power density is sufficiently high, renders the module inoperable by cutting off the series connections between adjacent cells.

Because the overlying metal film is not melted by the relatively low-powered laser used to ablate the semiconductor material in third grooves 128, shorts are not created by molten metal flowing into third grooves 128 or diffusing into the underlying photovoltaic regions. Furthermore, the ablated semiconductor material is thermally cooled by the overlying metal and by the sudden expansion of the vapors produced during ablation. This local cooling helps prevent recrystallization of amorphous silicon and the melting of the overlying metal film by the hot semiconductor vapors.

Even when a continuous gap 129 is formed by ablation of the underlying semiconductor material, metal flakes and other debris, designated by reference numerals 140 in FIG. 2(f), often remain along the edges of gap 129. Therefore, in accordance with the method of this invention, this debris is removed by subjecting module 110 to ultrasonic vibration in a fluid bath, preferably in water. After vibration, the resulting photovoltaic module has clean, unshorted gaps 129 separating adjacent back electrodes 122. Debris 140 also can be removed by blowing it away with a jet of nitrogen or other gas passed along gaps 129.

What is claimed is:

1. A method of manufacturing a photovoltaic device on a monolithic substrate, comprising the steps of:

(a) depositing a transparent conductive oxide film on a monolithic substrate to form a front contact layer;

(b) forming connection strips and solder pads substantially on said front contact layer by pumping and depositing conductive fluid providing a paste comprising at least one conductive material selected from the group consisting of silver, copper, nickel, aluminum, gold, platinum and palladium, through a nozzle in a predefined pattern on said front contact layer, said nozzle being positioned by an X-Y-Z positioner comprising an automated positioning system controlled by a computer, said predefined pattern defined only by said computer and thermally curing said conductive material after said conductive material has been deposited on said front contact layer;

(c) laser scribing substantially parallel first grooves in said front contact layer with a laser beam at a first power density to form front electrode segments on said monolithic substrate;

(d) depositing and forming a layer of a semiconductor material on said front electrode segments and said connection strips, and filling said first grooves with said semiconductor material;

(e) laser scribing second grooves in said layer of semiconductor material at positions substantially parallel to said first grooves with a laser beam at a second power density lower than said first power density to ablate said layer of semiconductor material in the absence of ablating said front electrode segments so as to form photovoltaic elements;

(f) depositing and forming a back contact layer comprising conductive material selected from the group consisting of aluminum and tin oxide, on said layer of semiconductor material, and filling said second grooves with said conductive material to form a series connection to connect said front electrode segments and said back contact layer; and (g) laser scribing third grooves in said back contact layer and photovoltaic elements at positions substantially parallel to said second grooves with a laser beam at a third power density of about 10 to 20 times higher than said second power density to ablate said semiconductor material of said photovoltaic elements in the absence of ablating said front electrode segments to form gaps in said back contact layer so as to form a plurality of back electrodes for photovoltaic cells.

2. The method according to claim 1 including forming bus means with said connection strips and solder pads for connecting submodules comprising said photovoltaic cells in a parallel connection.

3. The method according to claim 1 wherein said conductive fluid further comprises a carrier fluid and said carrier fluid is removed from said photovoltaic device by heating after said carrier fluid is deposited through said nozzle on said front contact layer.

4. The method according to claim 1 wherein said conducting fluid comprises silver and glass frit and said semiconductor material comprises a photovoltaic region selected from the group consisting of hydrogenated amorphous silicon, CdS/Cu $InSe_2$ and CdTe.

5. The method according to claim 1, wherein said predefined pattern of said connection strips includes a plurality of elongated narrow band strips of conductive material having a thickness within the range of 0.0005 to 0.0100 inches, said first grooves each have a width of about 25 micrometers, and said second grooves and said third grooves each have a width of about 100 micrometers.

* * * * *

UNITED STATES PATENT AND TRADEMARK OFFICE
CERTIFICATE OF CORRECTION

PATENT NO. : 5,593,901

DATED : January 14, 1997

INVENTOR(S) : Robert Oswald, John Mongon, Peggy Weiss

It is certified that error appears in the above-indentified patent and that said Letters Patent is hereby corrected as shown below:

| Col. | Line | |
|------|------|---|
| 2 | 44 | "large" should read --larger-- |

Signed and Sealed this

Eighteenth Day of November 1997

Attest:

BRUCE LEHMAN

Attesting Officer

Commissioner of Patents and Trademarks